United States Patent
Rozenblit et al.

(10) Patent No.: US 7,277,678 B2
(45) Date of Patent: Oct. 2, 2007

(54) FAST CLOSED-LOOP POWER CONTROL FOR NON-CONSTANT ENVELOPE MODULATION

(75) Inventors: Dmitriy Rozenblit, Irvine, CA (US); William J. Domino, Yorba Linda, CA (US); Darioush Agahi, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 688 days.

(21) Appl. No.: 10/281,486

(22) Filed: Oct. 28, 2002

(65) Prior Publication Data

US 2004/0083409 A1 Apr. 29, 2004

(51) Int. Cl.
*H01Q 11/12* (2006.01)
*H01B 1/04* (2006.01)

(52) U.S. Cl. ............... 455/91; 455/114.3; 455/127.1; 375/297; 330/149; 330/279

(58) Field of Classification Search ............ 455/522, 455/114.2–115.1, 126–127.2; 375/296–297, 375/312; 330/136, 149, 278–279
See application file for complete search history.

(56) References Cited

U.S. PATENT DOCUMENTS

| | | | | |
|---|---|---|---|---|
| 5,113,525 A * | 5/1992 | Andoh | ............. | 455/127.2 |
| 5,138,274 A * | 8/1992 | Nakanishi et al. | ............. | 330/136 |
| 5,548,826 A * | 8/1996 | Sayers | ............. | 455/126 |
| 5,768,694 A * | 6/1998 | Kumagai | ............. | 455/126 |
| 5,903,823 A * | 5/1999 | Moriyama et al. | ............. | 455/126 |
| 5,929,704 A * | 7/1999 | Proctor et al. | ............. | 330/149 |
| 5,933,767 A * | 8/1999 | Leizerovich et al. | ............. | 445/126 |
| 6,038,428 A * | 3/2000 | Mizusawa et al. | ............. | 455/69 |
| 6,069,530 A * | 5/2000 | Clark | ............. | 330/149 |
| 6,246,286 B1 * | 6/2001 | Persson | ............. | 330/149 |
| 6,272,336 B1 * | 8/2001 | Appel et al. | ............. | 455/423 |
| 6,275,685 B1 * | 8/2001 | Wessel et al. | ............. | 455/126 |
| 6,337,599 B2 * | 1/2002 | Lee | ............. | 330/149 |
| 6,449,466 B1 * | 9/2002 | Jin et al. | ............. | 455/127.2 |
| 6,480,705 B1 * | 11/2002 | Kusunoki | ............. | 455/126 |
| 6,847,261 B2 * | 1/2005 | Iwata et al. | ............. | 330/279 |
| 7,035,345 B2 * | 4/2006 | Jeckeln et al. | ............. | 375/296 |
| 7,062,236 B2 * | 6/2006 | Midtgaard et al. | ............. | 455/126 |
| 2001/0027090 A1 * | 10/2001 | Uesugi | ............. | 455/126 |
| 2002/0019218 A1 * | 2/2002 | Greverie et al. | ............. | 455/127 |
| 2002/0101938 A1 * | 8/2002 | Horaguchi et al. | ............. | 375/297 |
| 2002/0158688 A1 * | 10/2002 | Terosky et al. | ............. | 330/129 |
| 2004/0106385 A1 * | 6/2004 | Kazakevich et al. | ............. | 455/126 |
| 2004/0198465 A1 * | 10/2004 | Nation | ............. | 455/573 |

* cited by examiner

*Primary Examiner*—Simon Nguyen

(57) ABSTRACT

A system for a fast, closed power control loop that quickly adjusts the output power of a power amplifier in a non-constant amplitude modulation format. Embodiments of the invention allow fast and precise closed loop power control in a communication system that has a transmit signal that includes a phase modulated component and an amplitude modulated signal component. By detecting the level of the transmit signal before and after the power amplifier, the invention ignores changes in the amplitude of the transmit signal, resulting in an accurate measure of the power amplifier gain. The difference between the level of the transmit signal before and after the power amplifier provides a signal that represents the gain of the power amplifier. The gain signal is compared with a reference signal to develop an error signal. The error signal is used to control the output of the power amplifier.

22 Claims, 2 Drawing Sheets

FAST CLOSED-LOOP POWER CONTROL FOR NON-CONSTANT ENVELOPE MODULATION

BACKGROUND OF THE INVENTION

1. Field of the Invention

This invention relates generally to power control in a wireless communication device transmitter, and, more particularly, to fast, closed-loop power control for nonconstant envelope modulation formats.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone like communication handset. The different modulation and transmission schemes each have advantages and disadvantages.

In a typical global system for mobile communications (GSM) mobile communication system, a gaussian minimum shift keying ("GMSK") modulation scheme supplies a low-noise phase modulated ("PM") transmit signal to a non-linear power amplifier (PA) directly from an oscillator. In such an arrangement, a non-linear power amplifier, which is highly efficient, can be used thereby allowing efficient transmission of the phase modulated signal and minimizing power consumption. Because the modulated signal is supplied directly from an oscillator, the need for filtering, either before or after the power amplifier, is minimized.

Other transmission standards, however, require that both a PM signal and an amplitude modulated ("AM") signal be transmitted. The presence of the AM component results in what is referred to as a "non-constant envelope" transmit signal. In other words, the amplitude of the transmit signal has an amplitude that varies over time. Standards such as these increase the data rate without increasing the bandwidth of the transmitted signal. An example of such a standard is IS-95, which employs a code division multiple access (CDMA) modulation methodology. Further, new standards are evolving that will also use both phase modulation and amplitude modulation. For example, the enhanced data rates for GSM evolution (EDGE) standard, which is an extension to the GSM standard, and standards employing wide band code division multiple access (WCDMA), use a non-constant envelope modulation scheme.

Unfortunately, the existing GSM modulation scheme is not easily adapted to transmit a signal that includes both a PM component and an AM component because the PA cannot be driven directly from an oscillator, as is used in GSM.

This condition is further complicated because transmitters typically employed in GSM and EDGE communication systems transmit in bursts and must be able to precisely control the fast ramp-up and ramp-down of the transmit power as well as have a high degree of control over the output power level over a wide power range. This power control is typically performed using a closed feedback loop in which a portion of the signal output from the power amplifier is compared with a reference signal and the resulting error signal is integrated and fed back to the control input of the power amplifier.

CDMA is an example of a modulation scheme including both a PM component and an AM component. CDMA systems also require that the transmit power be accurately controlled. However, CDMA systems generally do not employ burst-type transmission, and therefore have no requirement for fast ramp-up and ramp-down of the power, as is used in GSM and EDGE. In non-burst transmission systems, such as CDMA, the output power may be controlled by a feedback loop having a time-constant that is very low compared to the time-constant of the amplitude variations of the modulator. Therefore the power control occurs at a sufficiently slow rate that it does not strip the AM signal component of the CDMA signal.

Unfortunately, the transmit signal used in EDGE requires much faster power control for ramping power up and down, where the allowed ramp time is on the order of a few symbols. Therefore, EDGE cannot use the same slow power control scheme as is used in CDMA. Such power control would be too slow for the EDGE power ramp-up and ramp-down. Further, the speed of the power control cannot simply be increased, since when attempting to include a PM component and an AM component in a nonconstant envelope modulation format, the closed power control loop will tend to cancel the amplitude variations present in the transmit signal while attempting to maintain the desired output power.

In such transmission signals containing both PM and AM components, the output power can be controlled by applying a predetermined control voltage to the power amplifier. Unfortunately, this does not provide real-time power control. If the gain characteristic of the PA drifts over time or over temperature, no correction will be applied. This results in incorrect levels of power being transmitted.

Another known method to control the output power is to "predistort" the modulated signal in such a way that the power control loop will cancel the effect of the predistortion. In such a method, the amplitude information is passed through a transfer function that is the inverse of the power control loop transfer function. Unfortunately, this method is costly and inefficient.

Therefore, there is a need in the industry for a transmission technique in which a fast closed loop power control system is applied to a linear power amplifier in which a signal having both a PM component and an AM component is amplified.

SUMMARY

The invention provides a system for power control using a closed power control feedback loop in applications in which a fast power ramp-up and ramp-down are desired. In one aspect, the invention may be conceptualized as system for controlling output power from an amplifier using a closed power control loop, comprising a power amplifier configured to receive a modulated signal, a first power detector configured to detect the modulated signal, and a second power detector configured to detect a portion of an output of the power amplifier. The system also includes a first comparator configured to develop a difference signal based upon the difference between the modulated signal and the detected portion of the output of the power amplifier, and a second comparator configured to develop an error signal used to adjust the output power of the power amplifier based upon the difference between the difference signal and a reference signal.

Embodiments of the invention allow fast and precise closed loop power control in a communication system that has a transmit signal that includes a phase modulated component and an amplitude modulated signal component.

By detecting the level of the transmit signal before and after the power amplifier, the invention ignores changes in the amplitude of the transmit signal, resulting in an accurate measure of the power amplifier gain. The difference between the level of the transmit signal before and after the power amplifier provides a signal that represents the gain of the power amplifier. This signal is compared against a reference signal to produce an error signal that is integrated and used to control the output of the power amplifier.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

The fast, closed power control feedback loop (hereafter referred to as the "fast, power control loop") of the invention may be implemented in any system in which a transmit signal includes a PM component and an AM component.

The fast, power control loop of the invention can be implemented in software, hardware, or a combination of software and hardware. Selected portions of the fast, power control loop are implemented in hardware and software. The hardware portion of the invention can be implemented using specialized hardware logic and/or analog circuit blocks. The software portion can be stored in a memory and be executed by a suitable instruction execution system (microprocessor). The hardware implementation of the fast, power control loop can include any or a combination of the following technologies that are all well known in the art: comparators, amplifiers, detectors, and possibly analog-to-digital (A/D) and digital-to-analog (D/A) converters, a discrete logic circuit(s) having logic gates for implementing logic functions upon data signals, an application specific integrated circuit having appropriate logic gates, a programmable gate array(s) (PGA), a field programmable gate array (FPGA), etc.

The fast, power control loop software comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium may include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
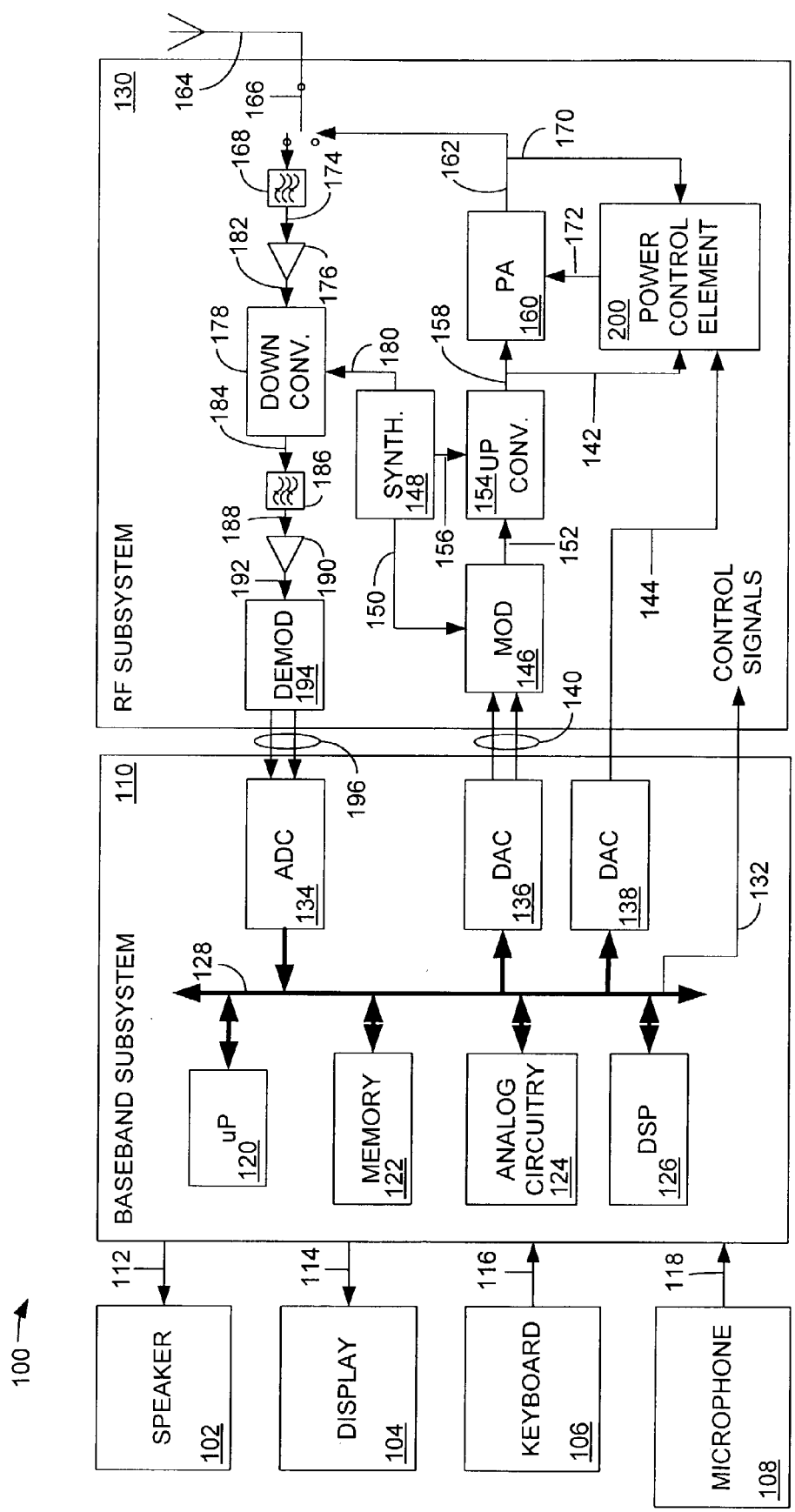
FIG. 1 is a block diagram illustrating a simplified portable transceiver including a power control element.

Turning now to the figures, FIG. 1 is a block diagram illustrating a simplified portable transceiver 100. Portable transceiver 100 includes speaker 102, display 104, keyboard 106, and microphone 108, all connected to baseband subsystem 110. In a particular embodiment, portable transceiver 100 can be, for example but not limited to, a portable telecommunication handset such as a mobile cellular-type telephone.

Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively.

The baseband subsystem 110 includes microprocessor (µP) 120, memory 122, analog circuitry 124, and digital signal processor (DSP) 126 in communication via bus 128. Bus 128, though shown as a single bus, may be implemented using a number of busses connected as necessary among the subsystems within baseband subsystem 110. Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to radio frequency (RF) subsystem 130 via connection 132. Although shown as a single connection 132, the control signals may originate from DSP 126 or from microprocessor 120, and are supplied to a variety of points within RF subsystem 130. It should be noted that, for simplicity, only the basic components of portable transceiver 100 are illustrated.

The baseband subsystem 110 also includes analog-to-digital converter (ADC) 134 and digital-to-analog converters (DACs) 136 and 138. Although DACs 136 and 138 are illustrated as two separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to RF subsystem 130 via connection 140. In accordance with an aspect of the invention, DAC 138 provides a reference voltage power level signal to power control element 200 via connection 144. Connection 140, while shown as two directed arrows, includes the information that is to be transmitted by RF subsystem 130 after conversion from the digital domain to the analog domain.

The RF subsystem 130 includes a modulator 146, which after receiving a frequency reference signal, also called a "local oscillator," signal, or "LO," from synthesizer 148 via connection 150, modulates the received analog information and provides a modulated signal via connection 152 to upconverter 154. Upconverter 154 also receives a frequency reference signal from synthesizer 148 via connection 156. Synthesizer 148 determines the appropriate frequency to which upconverter 154 will upconvert the modulated signal on connection 152.

The upconverter 154 supplies the modulated signal at the appropriate transmit frequency via connection 158 to power amplifier 160. Power amplifier 160 amplifies the modulated signal on connection 158 to the appropriate power level for transmission via connection 162 to antenna 164. Illustratively, switch 166 controls whether the amplified signal on connection 162 is transferred to antenna 164 or whether a received signal from antenna 164 is supplied to filter 168. The operation of switch 166 is controlled by a control signal from baseband subsystem 110 via connection 132. Alternatively, the switch 166 may be replaced by a filter pair (e.g., a duplexer) that allows simultaneous passage of both transmit signals and receive signals, as known to those having ordinary skill in the art.

The modulated signal at the appropriate transmit frequency on connection 158 is supplied via connection 142 to power control element 200. The signal on connection 142 represents the transmit signal prior to amplification by the power amplifier 160. A portion of the amplified transmit signal power on connection 162 is supplied via connection 170 to power control element 200. Power control element 200 forms a closed power control loop and supplies an information signal on connection 172 instructing the power amplifier 160 as to the correct power level to which the signal on connection 158 should be amplified. The operation of power control element 200 will be described in further detail with respect to FIG. 2.

A signal received by antenna 164 may, at the appropriate time, determined by baseband subsystem 110, be directed via switch 166, or alternatively by a duplexer (not shown) to receive filter 168. Receive filter 168 filters the received signal and supplies the filtered signal on connection 174 to low noise amplifier (LNA) 176. The receive filter 168 may be a bandpass filter that passes all frequencies of the particular cellular system where the portable transceiver 100 is operating. As an example, for a 900 MHz GSM system, receive filter 168 would pass all frequencies from 935.1 MHz to 959.9 MHz, covering all 124 contiguous channels of 200 kHz each. The purpose of this filter is to reject all frequencies outside the desired region. The LNA 176 amplifies the very weak signal on connection 174 to a level at which the downconverter 178 can translate the signal from the transmitted frequency to an IF frequency. Alternatively, the functionality of the LNA 176 and the downconverter 178 can be accomplished using other elements; such as for example but not limited to, a low noise block downconverter (LNB).

The downconverter 178 receives a frequency reference signal, also called a "local oscillator" signal, or "LO", from synthesizer 148, via connection 180. The LO signal instructs the downconverter 178 as to the proper frequency to which to downconvert the signal received from LNA 176 via connection 182. The downconverted frequency is called the intermediate frequency (IF). Downconverter 178 sends the downconverted IF signal via connection 184 to channel filter 186, also called the "IF filter." The channel filter 186 filters the downconverted signal and supplies it via connection 188 to amplifier 190. The channel filter 186 selects the one desired channel and rejects all others. Using the GSM system as an example, only one of the 124 contiguous channels is actually to be received. After all channels are passed by receive filter 168 and downconverted in frequency by downconverter 178, only the one desired channel will appear precisely at the center frequency of channel filter 186. The synthesizer 148, by controlling the local oscillator frequency supplied on connection 180 to downconverter 178, determines the selected channel.

The amplifier 190 amplifies the received signal and supplies the amplified signal via connection 192 to demodulator 194. Demodulator 194 recovers the transmitted analog information and supplies a signal representing this information via connection 196 to ADC 134. The ADC 134 converts these analog signals to a digital signal at baseband frequency and transfers it via bus 128 to DSP 126 for further processing.

As an alternative, the downconverted carrier frequency (IF frequency) at connection 184 may be 0 Hz, in which case the receiver is referred to as a "direct conversion receiver". In such a case the channel filter 186 is implemented as a low pass filter, and the demodulator 194 may be omitted.

Figure 2:
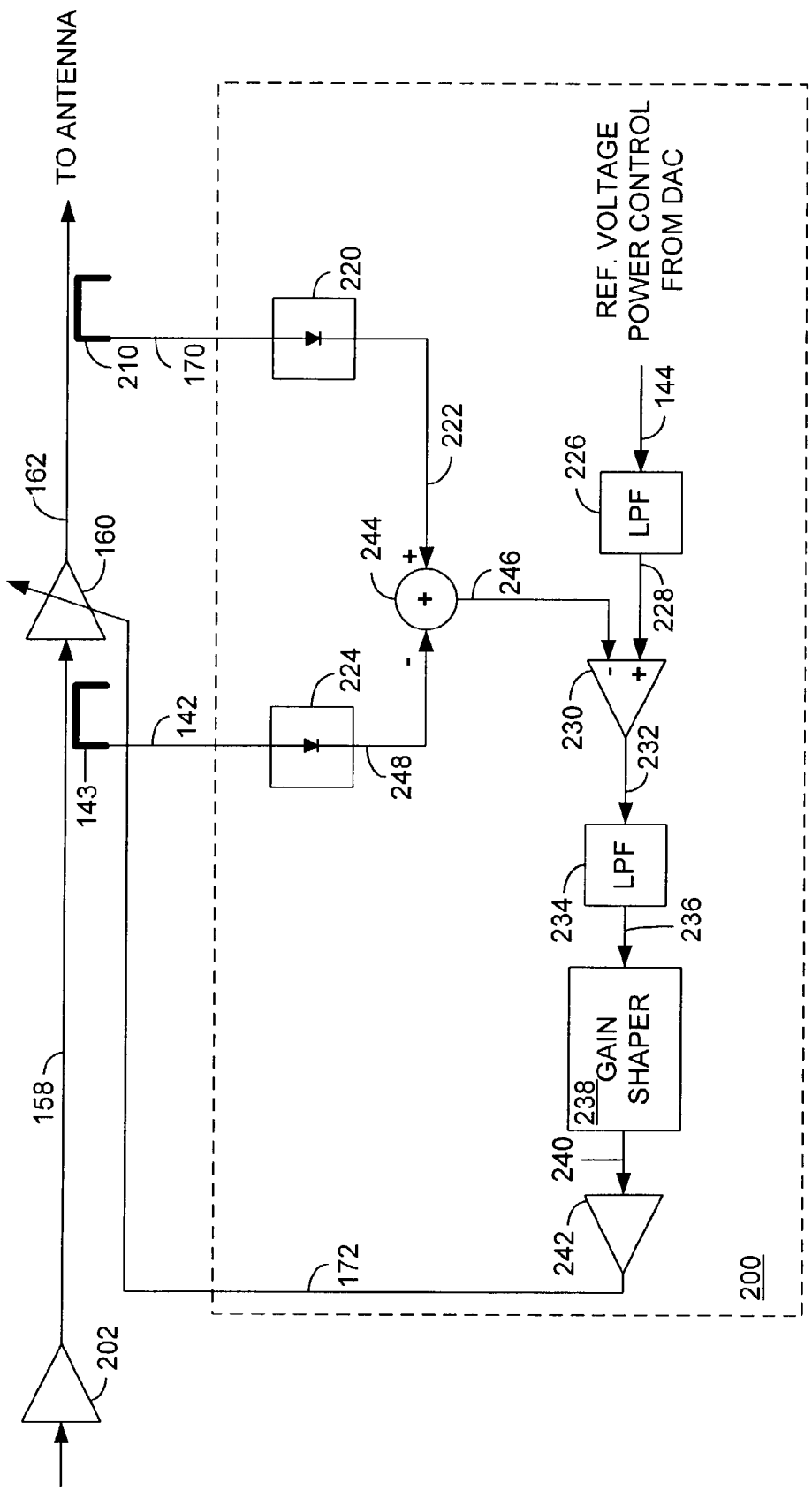
FIG. 2 is a block diagram illustrating, in further detail, the power control element of FIG. 1.

FIG. 2 is a block diagram illustrating the power control element 200 of FIG. 1. For simplicity, the function of the modulator 146 and the upconverter 154 of FIG. 1 are illustrated in FIG. 2 using amplifier 202. The modulated signal at the appropriate transmit frequency on connection 158 is supplied to logarithmic (log) detector 224 via connection 142. The log detector 224 provides a direct current (DC) baseband signal representing the level of the RF power signal present on connection 142. The DC baseband signal representing the level of the RF power on connection 142 is supplied to a comparator 244 via connection 248.

A portion of the power on connection 158 may be diverted to connection 142 by any one of several means, including but not limited to a direct connection, capacitive coupling, resistive divider, or a directional coupler, depending on practical implementation details such as the impedance of the circuits involved. In this example, a portion of the power on connection 158 is diverted to connection 142 via a directional coupler 143.

A portion of the output power of the power amplifier 160 present on connection 162 is diverted by a directional coupler 210 to a second log detector 220 via connection 170. The log detector 220 provides a DC baseband signal representing the level of the RF power signal present on connection 170 to the comparator 244 via connection 222. A portion of the power on connection 162 may diverted to connection 170 by any one of several means, including but not limited to a directional coupler (shown), capacitive coupling, resistive divider, or a direct connection, depending on practical implementation details such as the impedance of the circuits involved.

Preferably, the log detector 220 and the log detector 224 exhibit substantially identical characteristics, so that an accurate and instantaneous measurement of the power level of the signals on connections 158 and 162 can be obtained. It is also preferable that the two log detectors 220 and 224 work over approximately the same range of input power. Therefore it is preferred that the directional coupler 210 provide a coupling value that is approximately the inverse of the PA's midrange gain.

The comparator 244 compares (i.e., combines) the signal level on connection 222 with the signal level on connection 248 and provides a signal on connection 246 that represents the gain of the power amplifier 160. The comparator 244 determines the difference between the signals on connections 222 and 248. The signals on connections 222 and 248, supplied by the log detectors 220 and 224, respectively, may be current or voltage signals.

Importantly, the comparator 244 determines the difference between the two signals and provides a signal proportional to the gain of the power amplifier. Said another way, the level of signal on connection 246, or the "power amplifier gain signal," represents the difference between the input power supplied to the power amplifier 160 and the output power delivered by the power amplifier 160. The power amplifier gain signal represents the gain of the power amplifier 160 and is supplied on connector 246 to comparator 230. Using the difference between the input power level and the output power level of the power amplifier 160 causes the power control element 200 to ignore the AM signal component present on connections 158 and 162. While, the AM signal component exists at the input 158 to the power amplifier 160 and at the output 162 of the power amplifier 160 it is canceled when the signals are combined in the comparator 244. In this manner, the power control element 200 can quickly react to changes in desired output power, while allowing a non-constant envelope modulation signal to be input to the power amplifier 160, amplified and transmitted.

A reference voltage power control signal from the DAC 138 of FIG. 1 is supplied via connection 144 to low pass filter 226. The low pass filter 226 has a characteristic that allows the desired power level signal supplied on connection 144 to pass via connection 228 to comparator 230, while rejecting high frequency products that are due to the stair-step output function of DAC 138. The comparator 230 compares the level of the signal on connection 228 with the level of the power amplifier gain signal on connection 246 and provides an error signal representing the difference on connection 232. The error signal on connection 232 represents the difference between the gain of the power amplifier 160 and the desired output level supplied on connection 144.

The error signal on connection 232 is supplied to a loop filter 234, which, in this aspect of the invention, can be a passive filter, a band limited amplifier, or an integrator. In this example, the loop filter 234 operates as an integrator. The loop filter 234 supplies an integrated error signal on connection 236 to a gain shaper 238. The gain shaper 238 provides a non-linear transfer function that is substantially the inverse characteristic of the non-linear control shape of the power amplifier 160. In this way, the gain shaper 238 "linearizes" the fast, power control loop, because with it, the total loop gain becomes about the same at any operating point, i.e., at any power level.

It should be noted that the gain shaper 238 may be omitted if the power amplifier 160 exhibits a linear control characteristic. The signal from gain shaper 238 is supplied via connection 240 to driver 242. The driver 242 provides an amplified drive level of the signal on connection 240 via connection 172 to the control input of the power amplifier 160. In this manner, the output power of power amplifier 160 is controlled via power control element 200, while the AM component of the transmission signal is allowed to pass through the power amplifier 160 without being canceled by the power control element 200.

Essentially, the components within the power control element 200 form a fast, power control loop for power amplifier 160. In this manner, and with respect to this aspect of the invention, a portable transceiver 100 (FIG. 1) employing the fast, power control loop of the invention, can supply a transmit signal containing both a PM component and an AM component while quickly reacting to desired changes in output power level so that system timing and spectral mask requirements are met.

The closed power control loop of the invention uses two substantially identical log detectors to measure the instantaneous signal level at both the input and output of the power amplifier to be controlled. The difference between the outputs of these detectors provides an accurate measure of the amplifier's gain regardless of the level of the input signal. Using the difference between these two signals causes the power control loop to ignore any AM component in the signal, since the AM component will appear identically at the input and the output of the amplifier and be cancelled in the difference.

In an application where a modulated signal containing both a PM component and an AM component are supplied to a power amplifier, the power amplifier is preferably linear in order to reduce the occurrence of AM to PM conversion. AM to PM conversion occurs due to the inherent amplitude dependence of an amplifier's phase shift characteristic that is most severe in the case of highly efficient amplifiers. In such amplifiers, the signal's AM component causes the phase to be modulated as the amplifier's phase shift characteristic varies with the signal amplitude, resulting in a distorted transmit signal.

In such an application, the closed power control loop of the invention, and specifically the substantially identical log detectors 220 and 224 and comparator 244, can be used to provide fast, closed loop power control.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for controlling output power from an amplifier using a closed power control loop, comprising:
    detecting a modulated signal provided to a power amplifier using a first power detector;
    detecting a portion of an output of the power amplifier using a second power detector;
    comparing the modulated signal and the portion of the output power;
    developing a gain signal from the modulated signal and the portion of the output power;
    developing an error signal by comparing the gain signal to a reference signal;
    applying a non-linear transfer function that is substantially the inverse characteristic of the non-linear control shape of the power amplifier to the error signal to generate a modified error signal; and
    adjusting an output power of the power amplifier by applying the modified error signal to a control input of the power amplifier.

2. The method of claim 1, wherein the comparing includes generating a difference signal based upon the difference between the detected modulated signal and the detected portion of the output of the power amplifier, where the difference signal is the gain signal.

3. The method of claim 2, further comprising developing a control signal from the error signal and wherein adjusting includes controlling the output of the power amplifier by supplying the control signal to a control input of the power amplifier.

4. The method of claim 3, wherein the adjusting step includes comparing the gain signal with the reference signal to adjust the output power of the power amplifier.

5. The method of claim 1, wherein the modulated signal includes an amplitude modulated portion.

6. The method of claim 1, wherein the modulated signal includes a phase modulated portion.

7. The method of claim 1, wherein the first and second power detectors are logarithmic detectors.

8. A system for controlling output power from an amplifier using a closed power control loop, comprising:
   a power amplifier configured to receive a modulated signal and a control input;
   a first power detector configured to detect the modulated signal;
   a second power detector configured to detect a portion of an output of the power amplifier;
   a first comparator configured to develop a difference signal based upon the difference between the modulated signal and the detected portion of the output of the power amplifier;
   a second comparator configured to develop an error signal used to adjust the output power of the power amplifier based upon the difference between the difference signal and a reference signal; and
   a gain shaper configured to apply a non-linear transfer function to the error signal that is substantially the inverse characteristic of the non-linear control shape of the power amplifier, wherein an output of the gain shaper is coupled to the control input.

9. The system of claim 8, wherein the modulated signal includes a phase modulated portion and an amplitude modulated portion.

10. The system of claim 8, wherein the first and second power detectors are logarithmic detectors.

11. The system of claim 10, wherein the logarithmic detectors are substantially identical.

12. A system for controlling output power from a power amplifier using a closed power control loop, comprising:
   means for detecting a modulated signal supplied to the power amplifier;
   means for detecting a portion of an output of the power amplifier;
   means for developing a gain signal from the detected modulated signal and the detected portion of the output of the power amplifier;
   means for developing an error signal by comparing the gain signal with a reference signal;
   means for applying a non-linear transfer function to the error signal that is substantially the inverse characteristic of the non-linear control shape of the power amplifier to generate a modified error signal; and
   means for adjusting the output of the power amplifier by applying the modified error signal to a control input of the power amplifier.

13. The system of claim 12, wherein the means for developing a gain signal includes means for developing a difference signal based upon the detected modulated signal and the detected portion of the output of the power amplifier.

14. The system of claim 12, wherein the error signal is used to adjust the output power of the power amplifier based upon the difference signal and the reference signal.

15. The system of claim 12, wherein the modulated signal includes an amplitude modulated portion.

16. The system of claim 12, wherein the modulated signal includes a phase modulated portion.

17. A method for controlling output power from an amplifier using a closed power control loop, comprising:
   determining a gain of the power amplifier by detecting a modulated input to the power amplifier and the output of the power amplifier;
   developing a gain signal that represents the gain of the power amplifier;
   developing an error signal from the gain signal based upon the difference between the difference signal and a reference signal; applying a non-linear transfer function to the error signal that is substantially the inverse characteristic of the non-linear control shape of the power amplifier to generate a modified error signal; and
   controlling the output of the power amplifier by applying the modified error signal to a control input of the power amplifier.

18. The method of claim 17, further comprising:
   determining the gain of the power amplifier by measuring a power level of a transmit signal at an input to the power amplifier and at an output of the power amplifier; and
   combining the signal from the input to the power amplifier with the signal at the output of the power amplifier to develop the gain signal.

19. The method of claim 17, further comprising developing a control signal from the error signal and adjusting the output of the power amplifier by supplying the control signal to a control input of the power amplifier.

20. The method of claim 17, wherein the controlling includes comparing the gain signal with the reference signal to adjust the output power of the power amplifier.

21. The method of claim 17, wherein the modulated signal includes an amplitude modulated portion.

22. The method of claim 17, wherein the modulated signal includes a phase modulated portion.

* * * * *